United States Patent
Trzcinski et al.

(10) Patent No.: US 10,570,753 B2
(45) Date of Patent: Feb. 25, 2020

(54) APPARATUS AND METHOD FOR MASKING UNDER PLATFORM AREAS OF AIRFOIL COMPONENTS

(71) Applicant: UNITED TECHNOLOGIES CORPORATION, Farmington, CT (US)

(72) Inventors: Frank J. Trzcinski, Milford, PA (US); Andrew Cervoni, Staatsburg, NY (US); Scott A. Elliott, Rock Hill, NY (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 15/412,482

(22) Filed: Jan. 23, 2017

(65) Prior Publication Data

US 2018/0209279 A1    Jul. 26, 2018

(51) Int. Cl.
| | |
|---|---|
| *F01D 5/28* | (2006.01) |
| *C23C 4/134* | (2016.01) |
| *C23C 4/01* | (2016.01) |
| *C23C 14/04* | (2006.01) |
| *B05C 21/00* | (2006.01) |
| *B05B 12/20* | (2018.01) |

(52) U.S. Cl.
CPC .............. *F01D 5/288* (2013.01); *B05B 12/20* (2018.02); *B05C 21/005* (2013.01); *C23C 4/01* (2016.01); *C23C 4/134* (2016.01); *C23C 14/042* (2013.01); *F05D 2220/32* (2013.01); *F05D 2230/90* (2013.01); *Y10T 29/53* (2015.01)

(58) Field of Classification Search
None
See application file for complete search history.

(56) References Cited

U.S. PATENT DOCUMENTS

| | | | |
|---|---|---|---|
| 5,630,879 A | * | 5/1997 | Eichmann ............... C23C 14/02 118/500 |
| 5,733,102 A | * | 3/1998 | Lee ......................... F01D 5/187 415/115 |
| 5,792,267 A | | 8/1998 | Marszal et al. |
| 6,007,628 A | | 12/1999 | Ittleson et al. |
| 6,037,004 A | | 3/2000 | Zajchowski et al. |
| 6,082,291 A | | 7/2000 | Ittleson et al. |

(Continued)

FOREIGN PATENT DOCUMENTS

EP    1116523 A2    7/2001

OTHER PUBLICATIONS

European Search Report for EP 18153081.7 dated Jun. 5, 2018.

*Primary Examiner* — Jethro M. Pence
(74) *Attorney, Agent, or Firm* — Bachman & LaPointe, P.C.

(57) ABSTRACT

A fixture for masking a gas turbine engine blade, the blade having a root, a platform and an airfoil, the platform having inner and outer surfaces and peripheral faces extending between the surfaces, the fixture including a base with a receptacle for receiving the root of the blade; a removable sidewall mountable to the base to form a masking box with the receptacle that shields the root; a first removable Z plane detail mountable to the base, the first removable Z plane detail providing a first electrical contact point to the root; and a second removable Z plane detail mountable to the removable sidewall, the second removable Z plane detail providing a second electrical contact point to the root.

10 Claims, 5 Drawing Sheets

(56) References Cited

U.S. PATENT DOCUMENTS

| | | | |
|---|---|---|---|
| 6,109,873 | A | 8/2000 | Brooks et al. |
| 6,162,335 | A | 12/2000 | Jordan et al. |
| 6,224,673 | B1 | 5/2001 | Das et al. |
| 6,247,895 | B1 | 6/2001 | Brooks et al. |
| 6,273,676 | B1 | 8/2001 | Brooks et al. |
| 6,296,705 | B1 | 10/2001 | Ireland et al. |
| 6,332,926 | B1 | 12/2001 | Pfaendtner et al. |
| 6,352,406 | B1 | 3/2002 | Clare et al. |
| 6,391,115 | B1 | 5/2002 | Marszal et al. |
| 6,403,157 | B2 | 6/2002 | Ireland et al. |
| 6,485,655 | B1 | 11/2002 | Das et al. |
| 6,579,567 | B1 | 6/2003 | Das et al. |
| 6,616,969 | B2 | 9/2003 | Pfaendtner et al. |
| 6,706,323 | B2 | 3/2004 | Wheat et al. |
| 6,761,807 | B2 | 7/2004 | Velez, Jr. et al. |
| 6,863,927 | B2 | 3/2005 | Langley et al. |
| 6,913,442 | B2 | 7/2005 | Das et al. |
| 7,214,409 | B1 | 5/2007 | Kasule |
| 7,311,940 | B2 | 12/2007 | Nagaraj et al. |
| 7,384,522 | B2 | 6/2008 | Marszal et al. |
| 7,597,762 | B2 | 10/2009 | Albanese et al. |
| 7,635,119 | B1 | 12/2009 | Patel |
| 7,678,428 | B2 | 3/2010 | Barbezat et al. |
| 8,151,458 | B2 | 4/2012 | Hlavaty et al. |
| 8,349,086 | B2 | 1/2013 | Bernaski et al. |
| 8,353,259 | B2 | 1/2013 | Strock et al. |
| 8,603,582 | B2 | 12/2013 | Bernaski et al. |
| 8,839,739 | B2 | 9/2014 | Soucy et al. |
| 8,967,078 | B2 | 3/2015 | Soucy et al. |
| 8,997,351 | B2 | 4/2015 | Hlavaty et al. |
| 9,249,490 | B2 | 2/2016 | Trzcinski et al. |

\* cited by examiner

APPARATUS AND METHOD FOR MASKING UNDER PLATFORM AREAS OF AIRFOIL COMPONENTS

BACKGROUND

The present disclosure relates generally to masking and, more particularly, to a method an apparatus to mask turbine components.

Gas turbine engines, such as those that power modern commercial and military aircraft, generally include a compressor section to pressurize an airflow, a combustor section to burn hydrocarbon fuel in the presence of the pressurized air, and a turbine section to extract energy from the resultant combustion gases.

The compressor and turbine include one or more arrays of blades extending radially outwardly from a rotatable rotor hub. Each blade has a root that mates with a slot in the rotor hub to retain the blade. Each blade also has a platform that partly defines a circumferential inner boundary of an engine flowpath, and an airfoil that extends radially across the flowpath. During engine operation, a working medium, which flows axially along the flowpath, receives energy from the compressor blade arrays and provides energy to the turbine blade arrays. Those portions of the blades that come in direct contact with the working medium are subjected to a demanding operational environment. This is particularly true of the turbine blades, which are exposed to the elevated temperature and damaging effects of combustion products discharged from the engine's combustion chamber.

Various protective coatings are applied to the flowpath exposed surfaces of the blades to extend their useful life. Application of such coatings to other portions of the blades may be undesirable, since the presence of a layer of coating can interfere with the installation of the blades into the hub. Accordingly, various fixtures facilitate the application of a protective coating to selected portions of a blade, while shielding non-selected portions of the blade from the application of the coating. These fixtures are normally used in conjunction with a coating application apparatus such as a low pressure plasma spray coater or a physical vapor deposition coater.

Existing fixtures lasts only a limited number of coating cycles. During each coating cycle, a quantity of the coating accumulates on the fixture itself. After a number of coating cycles, further use of the fixture results in the formation of a coating "bridge" between the fixture and the blade platform. Once this bridge is established, it may become difficult to remove the blade from the fixture without chipping the coating from the platform and rendering the blade unsuitable for service. The blade must then be stripped and recoated.

To avoid the potential chipped coating damage to the blades, each fixture is typically used only a limited number of times and then is temporarily removed from service and refurbished by stripping the accumulated coating from the fixture with an acidic solution. This maintenance is relatively time consuming and expensive. Moreover, because each fixture is serviceable for only a limited number of coating cycles, a relative significant inventory of fixtures must be available so that the supply of serviceable fixtures is sufficient to support uninterrupted production runs.

SUMMARY

A fixture for masking a gas turbine engine blade, the blade having a root, a platform and an airfoil, the fixture according to one disclosed non-limiting embodiment of the present disclosure can include a base with a receptacle for receiving the root of the blade; a removable sidewall mountable to the base to form a masking box with the receptacle that shields the root of the blade; a first removable Z plane detail mountable to the base, the first removable Z plane detail providing a first electrical contact point to the root of the blade; and a second removable Z plane detail mountable to the removable sidewall, the second removable Z plane detail providing a second electrical contact point to the root.

A further embodiment of the present disclosure may include that the first and second removable Z plane detail each includes a tab that provides an electrical contact point to the root.

A further embodiment of the present disclosure may include that the tab has a rectilinear polygon shaped end surface.

A further embodiment of the present disclosure may include that the base includes a shank that defines a longitudinal axis, the longitudinal axis being parallel to an axis of the blade.

A further embodiment of the present disclosure may include that the Z-plane is a reference surface upon which the root is referenced with a turbine rotor disk.

A further embodiment of the present disclosure may include that the removable sidewall includes a first and a second edge rail that at least partially surrounds a forward wall and an aft wall of the receptacle to orient the removable sidewall to form the masking box.

A further embodiment of the present disclosure may include that the removable sidewall, the first removable Z plane detail, and the second Z plane detail are mountable to the base via a fastener.

A further embodiment of the present disclosure may include that at least one of the first removable Z plane detail and the second Z plane detail includes a hexagonal aperture for a head of the fastener.

A further embodiment of the present disclosure may include that the first removable Z plane detail includes a tab that extends through a slot in the base to provide the first electrical contact point to the root.

A further embodiment of the present disclosure may include that the second removable Z plane detail includes a tab that extends through a slot in the removable sidewall to provide the second electrical contact point to the root.

A further embodiment of the present disclosure may include that the base includes an indentation to receive the first removable Z plane detail. A further embodiment of the present disclosure may include that the removable sidewall includes an indentation to receive the second removable Z plane detail A method for selectively applying a coating to a gas turbine engine blade, the blade having a root, a platform and an airfoil, the method according to one disclosed non-limiting embodiment of the present disclosure can include locating the root into a partial receptacle formed by a base and mounting a removable Z plane detail to the base to complete the receptacle of the masking box to shield the root.

A further embodiment of the present disclosure may include mounting the removable Z plane detail to the base with a fastener.

A further embodiment of the present disclosure may include mounting a removable sidewall to the base to form the masking box with the receptacle that shields the root.

A further embodiment of the present disclosure may include mounting a second removable Z plane detail to the removable sidewall with a fastener.

A further embodiment of the present disclosure may include mounting the removable Z plane detail to provide an electrical contact point to the root.

A further embodiment of the present disclosure may include removing the removable Z plane detail from the base; stripping the accumulated coating from the base with an acidic solution.

A further embodiment of the present disclosure may include stripping the accumulated coating from the removable sidewall with an acidic solution.

A further embodiment of the present disclosure may include replacing the removable Z plane detail after a predetermined number of coating cycles.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
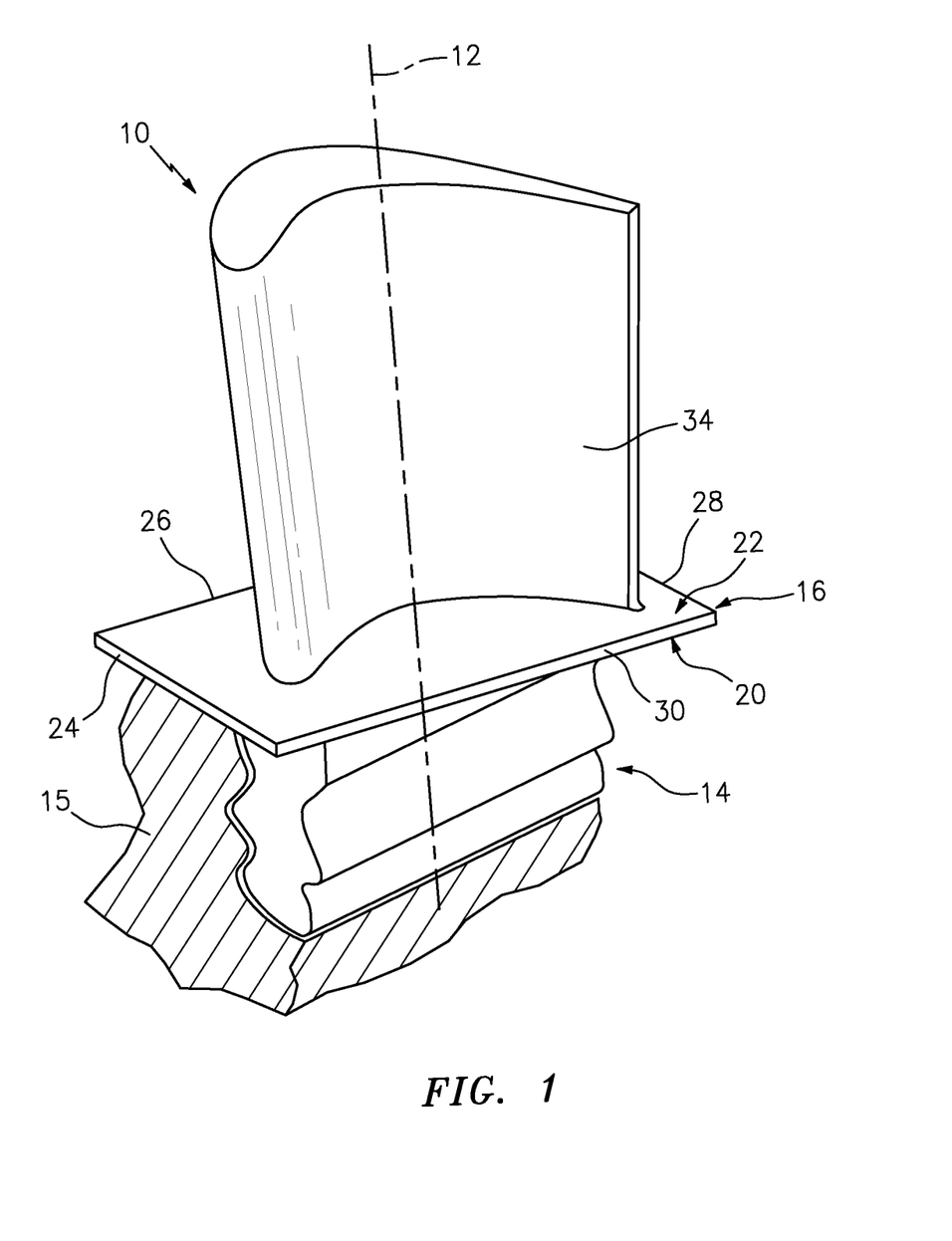
FIG. 1 is a general schematic view of an exemplary actively cooled component as a representative workpiece.

FIG. 1 schematically illustrates a general perspective view of an exemplary component 10, e.g., an actively cooled turbine blade of a gas turbine engine. It should be understood that although a particular component type is illustrated in the disclosed non-limiting embodiment, other components, such as blades, vanes, exhaust duct liners, nozzle flaps nozzle seals as well as other actively cooled components will also benefit herefrom. These components operate in challenging high-temperature environments such as a hot section of a gas turbine engine and have aggressive requirements in terms of durability and temperature allowances. It should be appreciated that not all turbine components as defined herein may be identical to that illustrated, and that other turbine components such as vanes and static structures that are to be masked will also benefit herefrom.

The component 10, for example a turbine rotor blade defined along a spanwise axis 12, generally includes a root 14, a platform 16 with an inner surface 20, an outer surface 22, peripheral faces 24, 26, 28, 30, and an airfoil 34. In one embodiment, the component 10 is manufactured from a high temperature superalloy. The root 14 need not be plated and the platform 16 segregates the airfoil 34 from the root 14. The root 14 also includes openings to cooling passages to communicate a coolant through the airfoil 34.

The root 14 may have a fir-tree, dovetail, or other convoluted shape, which is precision machined to fit within a correspondingly shaped slot in a rotor disk 15. Because of the precision machining, the addition of even small amounts of plating to the root 14 may adversely affect the tight tolerances in the assembly process. In addition, the plating materials may instigate fretting and thereby undesirably affect the fatigue life of the root 14.

When installed in a gas turbine engine, the root 14 mates with the correspondingly shaped slot in a rotatable hub so that the blade projects radially outwardly from the hub. The platform cooperates with platforms of adjacent blades installed in the hub to define a circumferential inner boundary of an engine flowpath. The airfoil extends radially across the flowpath so that both the airfoil and the outer surface 22 of each platform are directly exposed to the damaging influences of a working medium gas flowing through the flowpath. The root, the platform inner surface and the faces are not directly exposed to the working medium.

Figure 2:
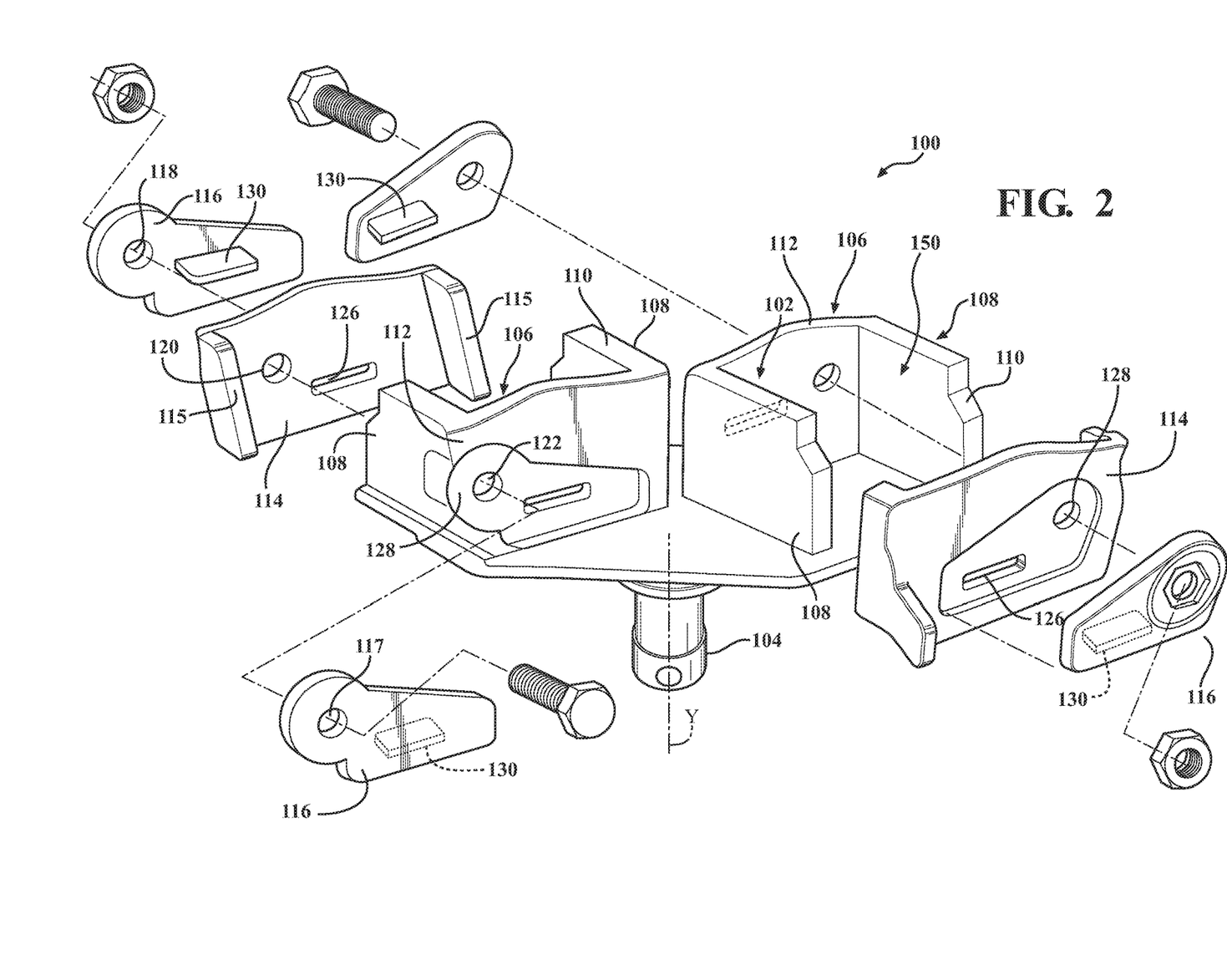
FIG. 2 is an exploded view of the fixture according to one disclosed non-limiting embodiment.

FIG. 2 illustrates one exemplary embodiment of a fixture 100 for applying a protective coating, such as a thermally insulating, oxidation resistant or corrosion resistant coating to the airfoil and the platform outer surface. The illustrated fixture 100 is capable of holding two blades at a time, however, fixtures with other capacities will benefit herefrom.

Figure 4:
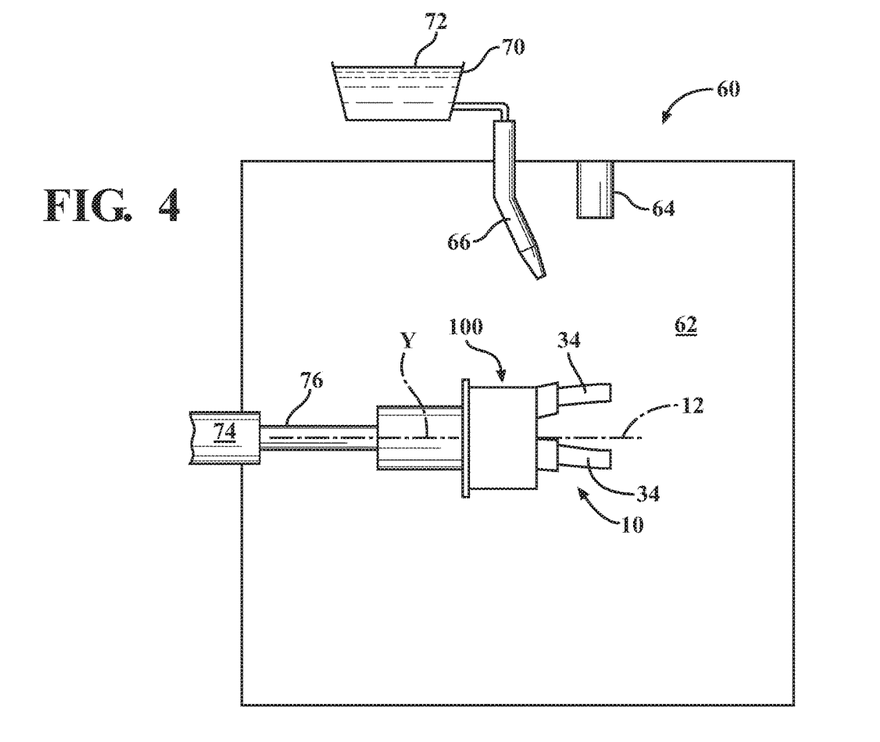
FIG. 4 is a schematic view of a coating apparatus for use with that can be used to coat an actively cooled turbine blade while it is disposed in the fixture of the FIG. 2.

In an embodiment, the fixture 100 is used in conjunction with a coating application apparatus such as the low pressure plasma spray (LPPS) coater 60 shown in FIG. 4. The coater includes a vacuum chamber 62 with a plasma spray gun 64 and a nozzle 66 projecting through one wall of the chamber. The nozzle is connected to a hopper 70 containing a supply of powder metal 72. A gripper 74 extends into the interior of the chamber. One end of a shaft 76 is removably connected to the gripper and the fixture 100 is removably connected to the other end of the shaft. During coating operations, the gun 64 generates a high temperature flame that vaporizes metal particles metered through the nozzle. The resultant metallic mist coats the exposed portions of the component 10 and accumulates on the fixture as well. An example of a powder metal used in the above-described coater is one that includes a nickel with significant amounts of cobalt, chromium and aluminum. Such a material, when deposited as a coating on selected surfaces of a turbine blade, forms a corrosion and oxidation resistant barrier and serves as a foundation for the subsequent application of a ceramic thermal barrier coating.

With continued reference to FIG. 2, the fixture 100 generally includes a base 102 with a shank 104 having a longitudinal axis Y. The base 102 defines a plane transverse to the longitudinal axis Y and the longitudinal axis Y is generally parallel to the axis 12 of each component 10. The base 102 includes, in this embodiment, two receptacles 106, each of which receives the root 14. Each receptacle 106 includes a forward wall 108, an aft wall 110, a first sidewall 112, a removable sidewall 114, and a first and second removable Z plane detail 116 associated with the first sidewall 112 and the removable sidewall 114. As defined herein "Z-plane" is a reference surface upon which the root 14 is referenced with the rotor. It should be appreciated that other reference surfaces may be utilized.

Figure 3:
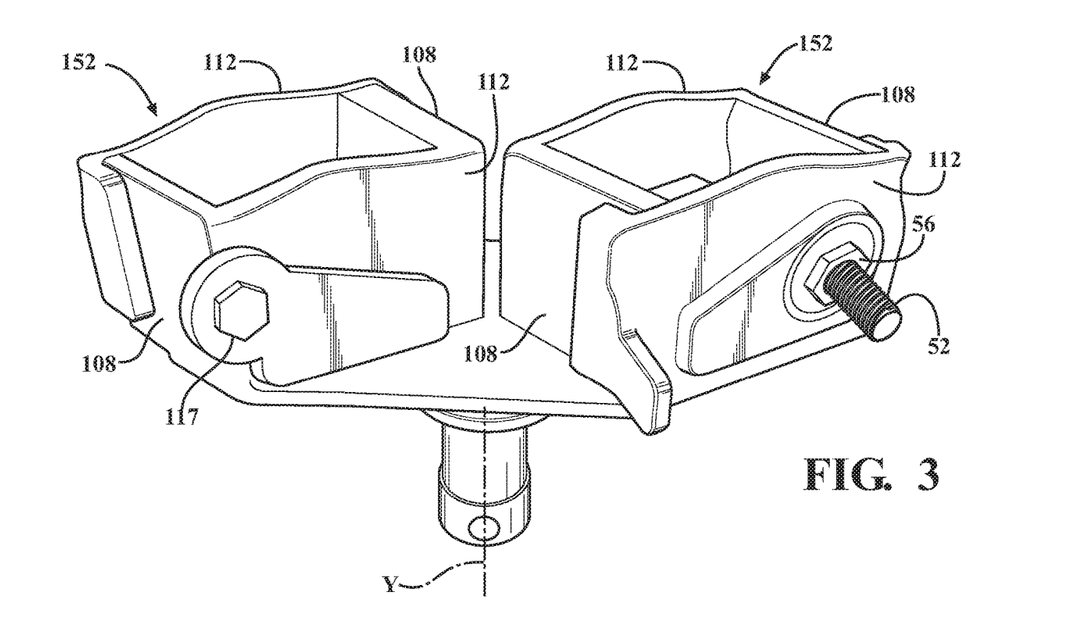
FIG. 3 is an assembled view of the fixture of FIG. 2.
Figure 5:
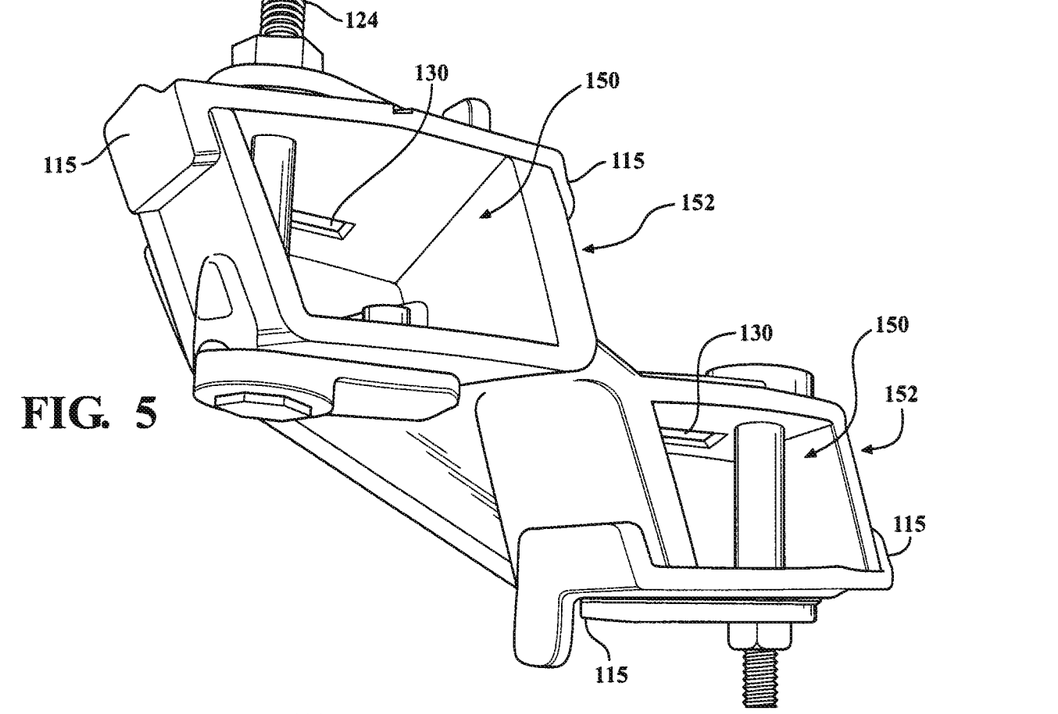
FIG. 5 is a top perspective view of the fixture of FIG. 2.

Each removable sidewall 114 includes edge rails 115 that at least partially surround the forward wall 108 and the aft wall 110 to properly orient that removable sidewall 114 to form a masking box 152 (FIGS. 3 and 5) that enshrouds and shields the area below the platform 16 during the, for example, Low Pressure Plasma Spray (LPPS) operation (FIG. 4).

The first sidewall 112, the removable sidewall 114, and the removable Z plane details 116, each include a respective aperture 118, to receive a fastener 124 such as a bolt and nut to secure the first sidewall 112, the removable sidewall 114, and the removable Z plane details 116 together to retain or otherwise sandwich the rotor blade in position by the root 14 for the coating process (FIG. 4). At least one of the removable Z plane details 116 may include a hexagonal indentation 117 (FIG. 3) to receive a head of the fastener 124 to rotationally restrain the fastener 124 and thereby facilitate assembly of the fixture 100.

Figure 6:
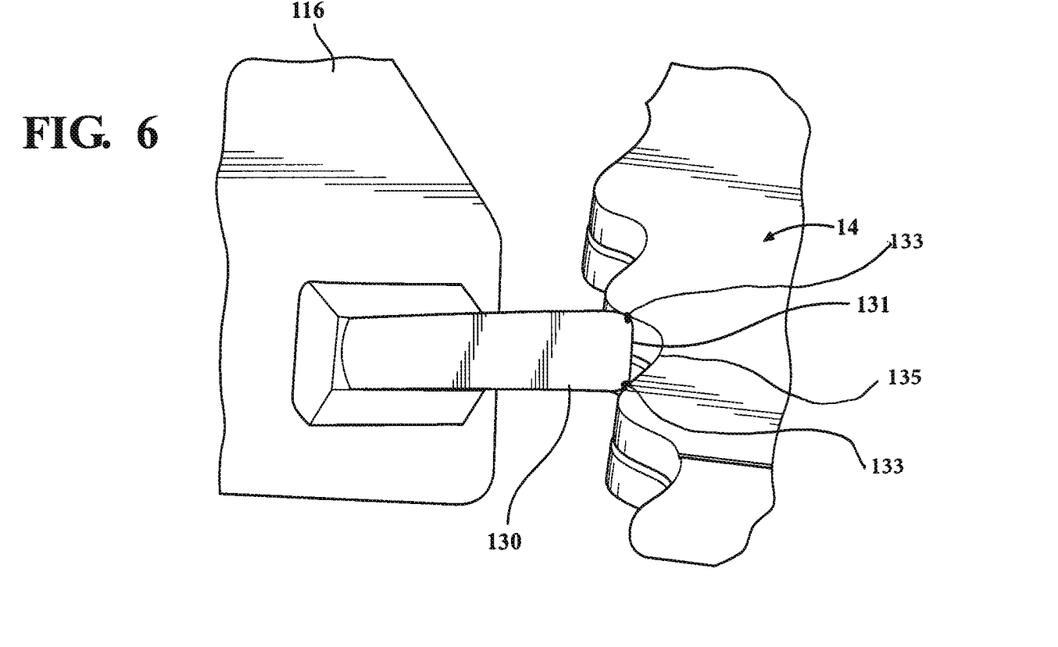
FIG. 6 is an expanded view of a Z plane detail interface with a blade root.

The first sidewall 112 and the removable sidewall 114 each include a respective slot 126 within an indentation 128 shaped to receive the respective removable Z plane details 116 such that a tab 130 from the respective removable Z plane details 116 can extend through the respective slot 126 to interface with the appropriate Z-plane serration of the root 14 (FIG. 6). The removable Z plane details 116 are shaped to interface with an allowable electrical contact point 133 on the root serration 135. The tabs 130 may include a rectilinear polygon shaped end surface 131 (FIG. 6). The tabs 130 are so shaped and configured so as to not interface with a non-reference surface of the Z-plane slot in the serrations of the root 14. That is, the tabs 130 do not influence the critical reference surfaces of the root 14 should electrical arcs occur during the Low Pressure Plasma Spray (LPPS) operation.

The removable Z plane details 116 facilitate stripping of the main masking box when subjected to acid stripping, while protecting removable Z plane details 116 from the corrosive effects of the acid. One benefit of not stripping the removable Z plane details 116 is that proper electrical contact with the root 14 ensures the component 10 is suitably retained in the fixture 100 as a result of clamping in the masking box 152 by the removable Z plane details 116. Since the removable Z plane details 116 are produced independently of the masking box, there is a cost savings as when the removable Z plane details 116 require replacement, only the removable Z plane details 116 need be replaced. The removable Z plane details 116 always remain in a desired electrical contact zone since the tabs 130 of the removable Z plane details 116 need not be subjected to the acid stripping and thus do not change dimensional tolerances over time.

Figure 7:
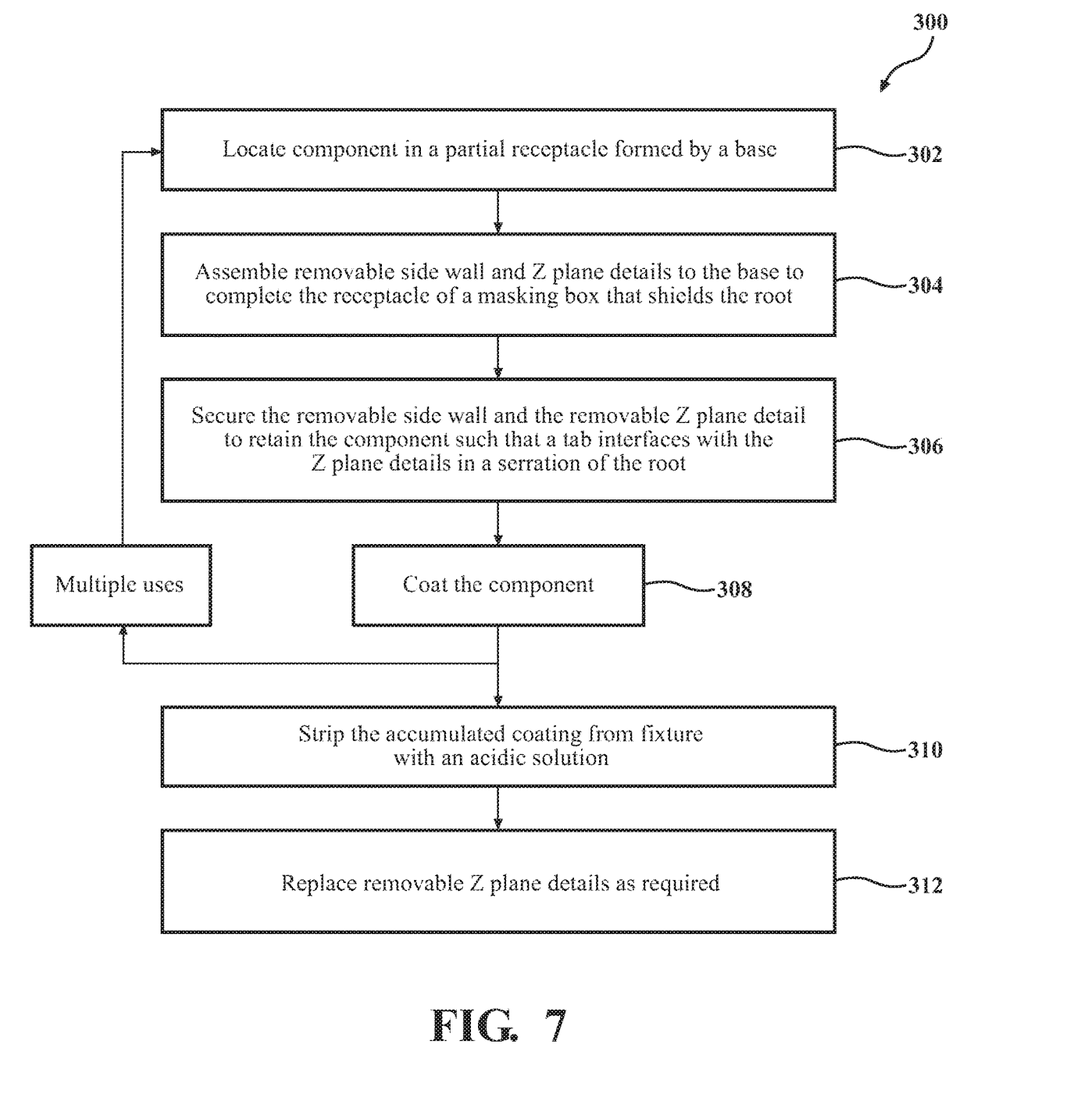
FIG. 7 is a method for selectively applying a coating to a gas turbine engine blade.

With reference to FIG. 7, a method 300 for selectively applying a coating to the component 10, is schematically disclosed in terms of a functional block diagram flowchart. It should be appreciated that alternative or additional steps may be provided without departing from the teaching herein.

Initially, the component 10 is inserted into the partially formed receptacle 150 (FIG. 2) of the fixture 100 (step 302). The removable sidewall 114 and the removable Z plane details 116 are then assembled to the base 102 to complete the receptacle 150 of the masking box 152 (FIG. 5) that shields the root 14 (step 304). Respective fasteners 124 secure the first sidewall 112, the removable sidewall 114, and the removable Z plane details 116 together to form the receptacle 150 (FIG. 5) that retains the component 10 such that the tab 130 extends through the respective slot 126 to interface with the Z-plane in a serration of the root (step 306).

Next, the component 10 is coated (step 308; FIG. 4). Various coating processes may be utilized, but here, a Low Pressure Plasma Spray (LPPS) operation is utilized.

After a predetermined number of coating cycles, the accumulated coating may be stripped from the fixture 100 with an acidic solution (step 310). It should be appreciated that the acidic solution tends to slowly eat away, and thus change, the dimensions of the material from which the fixture 100 is manufactured. The removable Z plane details 116 need not be stripped with the acidic solution at the same frequency as the other components of the fixture 100 thus avoiding dimensional degradation. Further, the removable Z plane details 116 may simply and relatively inexpensively be replaced at select coating cycle intervals to assure a proper interface with the component 10 (step 312).

The use of the terms "a" and "an" and "the" and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. It should be appreciated that relative positional terms such as "forward," "aft," "upper," "lower," "above," "below," and the like are with reference to the normal operational attitude of the vehicle and should not be considered otherwise limiting.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be appreciated that like reference numerals identify corresponding or similar elements throughout the several drawings. It should also be appreciated that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

The invention claimed is:

1. A fixture for masking a gas turbine engine blade, the blade having a root, a platform and an airfoil, the fixture comprising:
 a base with a receptacle for receiving the root of the blade;
 a removable sidewall mountable to the base to form a masking box with the receptacle that shields the root of the blade;
 a first removable Z plane detail mountable to the base, the first removable Z plane detail shaped to interface with a root serration of the root to form a first electrical contact point with the gas turbine engine blade, wherein the first removable Z plane detail comprises a tab that extends through a slot in the base to form the first electrical contact point to the root;

a second removable Z plane detail mountable to the removable sidewall, the second removable Z plane detail providing a second electrical contact point to the root, wherein the second removable Z plane detail comprises a tab that extends through a slot in the removable sidewall to form the second electrical contact point to the root; and a fastener configured to mount through the removable sidewall, the first removable Z plane detail, the second removable Z plane detail, and the base, wherein the fastener is configured to retain the first removable Z plane detail to the base, the second removable Z plane detail to the removable sidewall and the removable sidewall to the base to sandwich the root of the blade therein.

2. The fixture as recited in claim 1, wherein the tab includes a rectilinear polygon shaped end surface.

3. The fixture as recited in claim 1, wherein the removable sidewall includes a first and a second edge rail that at least partially surrounds a forward wall and an aft wall of the receptacle to orient the removable sidewall to form the masking box.

4. The fixture as recited in claim 1, wherein at least one of the first removable Z plane detail and the second Z plane detail includes a hexagonal aperture for a head of the fastener.

5. The fixture as recited in claim 1, wherein the base includes an indentation to receive the first removable Z plane detail.

6. The fixture as recited in claim 1, wherein the removable sidewall includes an indentation to receive the second removable Z plane detail.

7. The fixture as recited in claim 1, further comprising a shank that extends from said base, said shank defines a longitudinal axis, the longitudinal axis being parallel to an axis of the blade.

8. The fixture as recited in claim 1, wherein the Z-plane is a reference surface upon which the root serration of the root is referenced with a turbine rotor disk.

9. The fixture as recited in claim 1, wherein the first removable Z plane detail is mountable to the base opposite the receptacle that shields the root of the blade.

10. The fixture as recited in claim 1, wherein the second removable Z plane detail is mountable to the removable sidewall opposite the receptacle that shields the root of the blade.

* * * * *